United States Patent
Lee et al.

(10) Patent No.: US 11,469,658 B2
(45) Date of Patent: Oct. 11, 2022

(54) POWER SUPPLY APPARATUS WITH DYNAMIC SCALING FEATURE OF SWITCHING FREQUENCY

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Jong Wan Jo, Suwon-si (KR); Kyung Duk Choi, Suwon-si (KR); Young Gun Pu, Suwon-si (KR)

(73) Assignees: SKAIChipsCo., Ltd., Suwon-si (KR); Research & Business Foundation SUNGKYUNKWAN UNIVERSITY, Suwon-si (KR)

(*) Notice: Subject to any disclaimer, the term of this patent is extended or adjusted under 35 U.S.C. 154(b) by 44 days.

(21) Appl. No.: 17/117,037

(22) Filed: Dec. 9, 2020

(65) Prior Publication Data

US 2021/0175800 A1    Jun. 10, 2021

(30) Foreign Application Priority Data

Dec. 10, 2019  (KR) .................. 10-2019-0163226

(51) Int. Cl.
  *H02M 1/00* (2006.01)
(52) U.S. Cl.
  CPC ....... *H02M 1/0012* (2021.05); *H02M 1/0003* (2021.05); *H02M 1/0009* (2021.05)
(58) Field of Classification Search
  CPC ............. H02M 1/0003; H02M 1/0016; H02M 1/0025; H02M 1/0032; H02M 1/0041; H02M 3/1566; H02M 3/156; H02M 3/158
  See application file for complete search history.

(56) References Cited

U.S. PATENT DOCUMENTS

| | | | | |
|---|---|---|---|---|
| 10,218,270 B1* | 2/2019 | Lin | ..................... | H02M 3/157 |
| 2012/0242314 A1* | 9/2012 | Namekawa | .............. | H03K 7/08 |
| | | | | 323/283 |
| 2013/0300391 A1* | 11/2013 | Lee | ..................... | H02M 3/157 |
| | | | | 323/283 |
| 2015/0280557 A1* | 10/2015 | Xue | ..................... | H02M 3/156 |
| | | | | 323/271 |
| 2016/0359411 A1* | 12/2016 | Ihs | ..................... | H02M 3/157 |
| 2018/0123440 A1* | 5/2018 | Lee | ..................... | H02M 1/08 |

FOREIGN PATENT DOCUMENTS

KR    10-2007-0088885 A    8/2007

OTHER PUBLICATIONS

An office action dated May 29, 2020 for Korean Application No. 10-2019-0163226.

* cited by examiner

*Primary Examiner* — Alex Torres-Rivera
(74) *Attorney, Agent, or Firm* — Insight Law Group, PLLC; Seung Lee (57) ABSTRACT

Disclosed is a power supply apparatus including a DC-DC converter implemented as one integrated circuit. A duty of a switching pulse of a DC-DC conversion unit is controlled according to a phase difference between a feedback clock signal and a reference clock signal having a frequency proportional to an output voltage of the DC-DC conversion unit. The duty of the switching pulse may be controlled from an output of a charge pump to be charged and discharged according to the phase difference signal between the feedback clock signal and the reference clock signal.

9 Claims, 4 Drawing Sheets

POWER SUPPLY APPARATUS WITH DYNAMIC SCALING FEATURE OF SWITCHING FREQUENCY

RELATED APPLICATIONS

This application claims priority to Korean Patent Application No. 10-2019-0163226, filed on Dec. 10, 2019 in the Korean Intellectual Property Office, the entire disclosure of which is incorporated herein by reference.

BACKGROUND OF THE INVENTION

1. Field of the Invention

The present invention relates to a technique for a power supply apparatus.

2. Description of the Related Art

There is an issue of reducing a size of an inductor when implementing a DC-DC converter into one integrated circuit. If increasing a switching frequency to reduce the size of the inductor, a problem related to stability occurs in a feedback loop, and a problem entailed in the size of the resistor or capacitor used for compensation occurs. In addition, efficiency is deteriorated, for example, an output ripple or settling time is increased.

In the case of a multiple power supply apparatus that supports dynamic voltage scaling, a reference frequency of the switching pulse may vary over a large range, and the above-described problems become more serious.

SUMMARY OF THE INVENTION

In consideration of the above-mentioned circumstances, it is an object of the present invention to improve output characteristics or efficiency when implementing a power supply apparatus as one integrated circuit.

According to an aspect of the present invention, a duty of a switching pulse of a DC-DC conversion unit is controlled according to a phase difference between a feedback clock signal having a frequency proportional to an output voltage of the DC-DC conversion unit and a reference clock signal.

According to another aspect, the duty of the switching pulse may be controlled from an output of a charge pump which is charged and discharged according to a phase difference signal between the feedback clock signal and the reference clock signal.

According to another aspect, one of a plurality of signals obtained by modulating the reference clocks so as to have different duties from each other may be selected by reflecting fluctuations in the output voltage and output a switching pulse.

According to another aspect, a frequency of the reference clock signal may be determined according to an external instruction signal.

According to another aspect, the duty of the switching pulse and the frequency of the reference clock thereof may be simultaneously controlled according to a fluctuation in an output voltage of a DC-DC conversion unit.

According to another aspect, input and output parameters of the DC-DC conversion unit are measured to determine initial values of control parameters of the DC-DC converter, and then the control parameters may be controlled to be added to and subtracted from the initial values according to the fluctuation in the output load.

According to the present invention, it is possible to maintain stability of feedback by changing the output voltage to a frequency and performing feedback, and increase the switching frequency while reducing a capacity and reducing an area so that devices connected to an outside such as an inductor or capacitor may be included in a chip. Further, when the output voltage is fed back with a frequency, the stability of the feedback may be enhanced by adopting a charge pump structure used in a phase locked loop.

According to the present invention, the duty of the switching pulse and the frequency of the reference clock may be simultaneously controlled according to the fluctuation in the output voltage of the DC-DC conversion unit, and the parameter of the power output to a load may be settled.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The above-described and additional aspects are embodied through embodiments which will be described with reference to the accompanying drawings. It should be understood that components of the respective embodiments may be variously combined within the embodiments unless otherwise stated or contradictory to each other.

Figure 1:
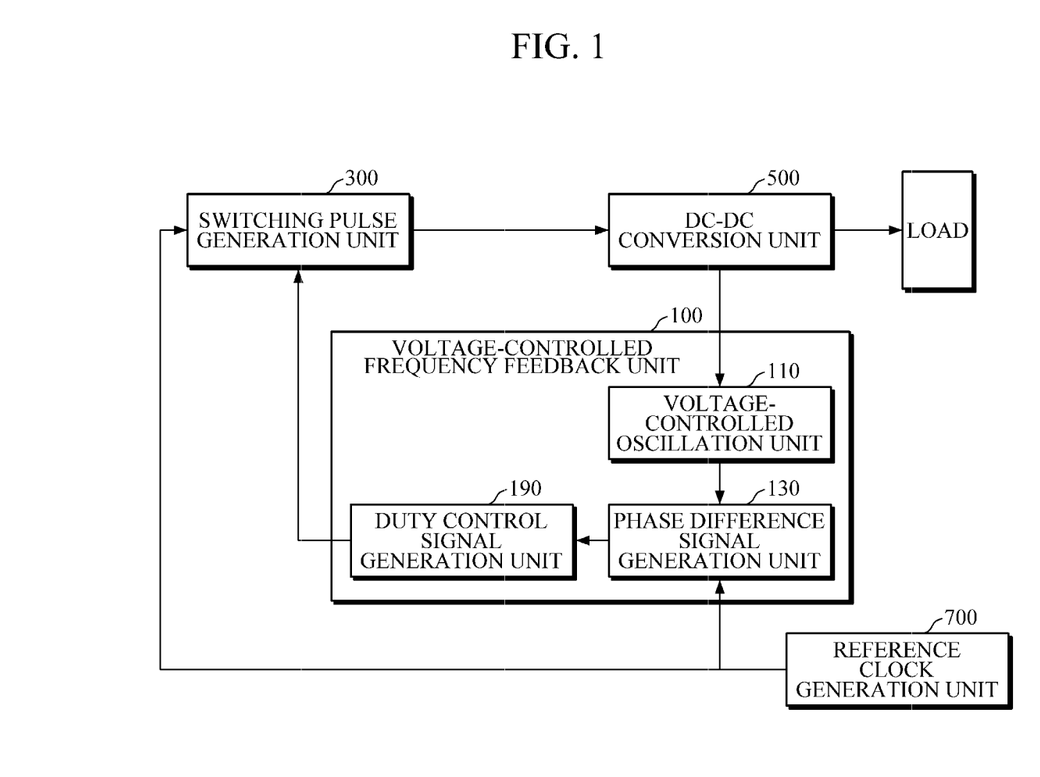
FIG. 1 is a block diagram illustrating a configuration of a power supply apparatus according to an embodiment.

According to an aspect of the present invention, a duty of a switching pulse of a DC-DC conversion unit is controlled according to a phase difference between a feedback clock signal having a frequency proportional to an output voltage of the DC-DC conversion unit and a reference clock signal. FIG. 1 is a block diagram illustrating a configuration of a power supply apparatus according to an embodiment. As shown in FIG. 1, the power supply apparatus according to an embodiment includes a reference clock generation unit 700, a switching pulse generation unit 300, a DC-DC conversion unit 500, and a voltage-controlled frequency feedback unit 100. The reference clock generation unit 700 generates and outputs a reference clock. Several techniques are known in the art, which are capable of integrating a circuit that generates a clock signal having a constant cycle into a semiconductor chip. The switching pulse generation unit 300 generates and outputs a switching pulse obtained by changing the duty of the reference clock. PWM modulation for modulating the input clock signal so as to have a given duty is a known technique. The duty may be indicated through voltage or digitally encoded information. The DC-DC conversion unit 500 switches an input power by the switching pulse, converts it into a DC voltage, and outputs the converted DC voltage. In one embodiment, the DC-DC conversion unit 500 may be a buck converter.

The voltage-controlled frequency feedback unit 100 generates and outputs a duty control signal for controlling the duty of the switching pulse which is generated and output by a switching pulse generation unit from a phase difference signal proportional to a phase difference between a feedback clock signal having a frequency proportional to the output voltage of the DC-DC conversion unit 500 and the reference clock signal output by the reference clock generation unit 700.

The output voltage of the DC-DC conversion unit 500 to a load is fed back as a frequency signal by the voltage-controlled frequency feedback unit 100 to control the duty of the switching pulses generated by the switching pulse generation unit 300 according to the phase difference with the reference signal. Herein, the duty is controlled in such a way that, when the output voltage is higher than a set voltage, the duty of the switching pulse is decreased, and when the output voltage is lower than the set voltage, the duty of the switching pulse is increased.

In the illustrated embodiment, a fluctuation in the output voltage of the DC-DC conversion unit 500 is converted into a frequency fluctuation and fed back. Reliable settlement of the reference clock may help to achieve the stability of the feedback.

The voltage-controlled frequency feedback unit 100 according to an embodiment may include a voltage-controlled oscillation unit 110, a phase difference signal generation unit 130, and a duty control signal generation unit 190. The voltage-controlled oscillation unit 110 oscillates and outputs a feedback clock signal having a frequency proportional to the output voltage of the DC-DC conversion unit 500. A voltage controlled oscillator (VCO) that oscillates a clock signal with a frequency proportional to the input voltage is a known electric circuit.

The phase difference signal generation unit 130 outputs a phase difference signal by detecting a phase difference between the feedback clock signal and the reference clock signal. In one embodiment, the phase difference signal generation unit 130 is implemented as a phase detector. The phase detector is a resonance circuit which is implemented as an analog multiplier, a frequency mixer, or a logic circuit to output a voltage signal representing a phase difference between two input signals. As is known in the art, the phase difference reflects a difference in the frequency. When implementing the phase detector as a logic circuit, the output of the phase difference detection unit 131 may be a pulse train having a duty proportional to the phase.

The duty control signal generation unit 190 generates and outputs a duty control signal for controlling the duty of the switching pulse generated and output by the switching pulse generation unit from the output of the phase difference signal generation unit 130. In one embodiment, the duty control signal generation unit 190 may output an average voltage, that is, a voltage signal proportional to the duty, by integrating pulse train outputs which are output from the phase difference signal generation unit 130. In this case, the duty control signal may be supplied as an input to a duty setting input terminal of the PWM modulation chip of the switching pulse generation unit 300.

Figure 2:
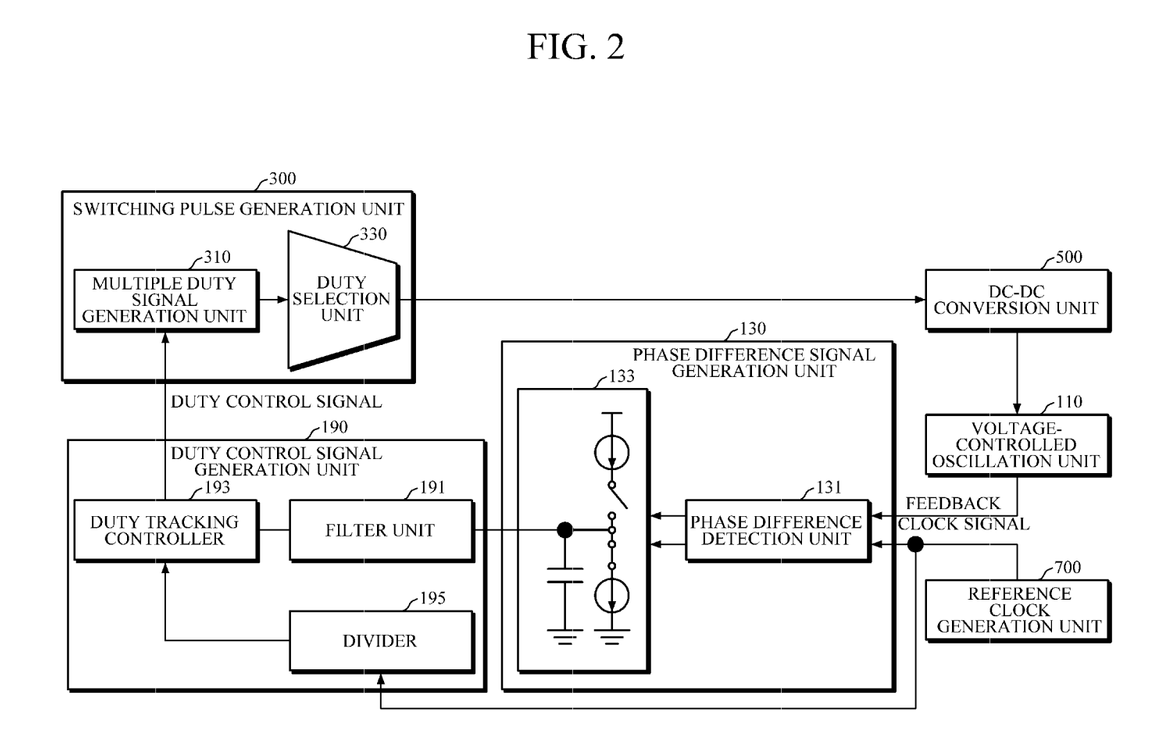
FIG. 2 is a block diagram illustrating a configuration of a power supply apparatus according to another embodiment.

According to another aspect of the present invention, the duty of the switching pulse may be controlled from an output of a charge pump which is charged and discharged according to the phase difference signal between the feedback clock signal and the reference clock signal. FIG. 2 is a block diagram illustrating a configuration of a power supply apparatus according to another embodiment. Components similar to those of the embodiment shown in FIG. 1 are denoted by the same reference numerals. These similar components will not be described.

As shown in FIG. 2, in a power supply apparatus according to another embodiment, a phase difference signal generation unit 130 includes a phase difference detection unit 131 and a charge pump 133. The phase difference detection unit 131 detects a phase difference between a feedback clock signal output by the voltage-controlled oscillation unit 110 and a reference clock signal output by a reference clock generation unit 700. In the illustrated embodiment, the phase difference detection unit 131 may be a phase frequency detector that detects the phase difference between the feedback clock signal and the reference clock signal and outputs a phase difference signal. The phase frequency detector is one of asynchronous circuits originally composed of flip-flops, and determines which of two signals is fast or frequently zero-crossing, and outputs two positive and negative signals. However, it is not limited thereto, and in the present invention, the phase difference detection unit 131 may be implemented as one of a phase detector circuits.

In the illustrated embodiment, the charge pump 133 is implemented as a pair of bipolar-switched current sources used in a phase locked loop. Pulse trains having phases opposite to each other output from the phase frequency detector are fed as an input to gates of two switches of the charge pump 133. The charge pump 133 is charged and discharged according to the phase difference signal. That is, the charge pump is charged when the phase difference signal is a positive, and is discharged when it is negative. However, it is not limited thereto, and in the present invention, the charge pump 133 may be implemented as one of several types of charge pumps used in an analog phase locked loop.

As shown in FIG. 2, in the power supply apparatus according to another embodiment, a duty control signal generation unit 190 includes a filter unit 191 and a duty tracking controller 193. The filter unit 191 settles the output of the charge pump 133 and outputs a phase difference voltage signal. In the illustrated embodiment, the filter unit 191 is implemented as a low pass filter.

The duty tracking controller 193 generates and outputs a duty control signal obtained by reflecting the current duty from the phase difference voltage signal. In one embodiment, the duty tracking controller 193 may be an encoder that encodes the phase difference voltage signal into digital bytes according to a voltage level and outputs the same. The encoding reference levels of the encoder may be equally divided like an A/D converter, but may be unequally divided by reflecting the stability of feedback or characteristics of the circuit. The duty tracking controller 193 outputs a duty control signal in a direction to increase or decrease the duty by reflecting a degree in which the output voltage is deviated from the reference based on the current duty. For example, when the current duty is 70% and the phase difference voltage signal filtered by the filter unit 191 is zero (0), that is, the voltage of the output power to the load matches with a rated voltage, the existing value is maintained as it is in the duty control signal which is encoded so as to maintain the duty. In other words, the phase difference voltage signal may be reflected as a variation value from a value currently output by the duty tracking controller 193. In the illustrated embodiment, the duty tracking controller 193 outputs a duty control signal by synchronizing with the clock obtained by dividing the reference clock from the reference clock generation unit 700 by the divider 195. A division ratio of the divider 195 may be appropriately determined according to a degree of precision of the output power or response characteristics to the load.

In the illustrated embodiment, the switching pulse generation unit 300 outputs a pulse, which is synchronized with the reference pulse and has a duty corresponding to this digital byte, as a switching pulse. For example, the switching pulse generation unit 300 may be implemented as a microprocessor or a high-speed counter.

According to another aspect of the present invention, one of a plurality of signals obtained by modulating the reference clock so as to have different duties from each other may be selected by reflecting fluctuations in the output voltage, and output a switching pulse. In the power supply apparatus according to another embodiment, the switching pulse generation unit 300 may include a multiple duty signal generation unit 310 and a duty selection unit 330. The multiple duty signal generation unit 310 generates a plurality of switching pulse signals obtained by modulating the reference clock so as to have different duties from each other. In one embodiment, the multiple duty signal generation unit 310 includes nine pulse signal generation units configured to output switching pulse signals having duties of 10% to 90% while being synchronized with the reference clock signal, respectively. Techniques for PWM modulation of an input pulse signal so as to have a given duty are well known in the art.

The duty selection unit 330 outputs one signal selected by the duty control signal among the plurality of switching pulse signals. In one embodiment, the duty selection unit 330 is a multiplexer. In the illustrated embodiment, the selection input of the multiplexer is a digital byte output by the duty tracking controller 193. That is, in the illustrated embodiment, the duty tracking controller 193 outputs a digital byte encoded according to the phase difference voltage signal filtered by the filter unit 191. For example, when the duty tracking controller 193 outputs a digital byte having a value proportional to the voltage level of the phase difference voltage signal, the plurality of switching pulse signals input to the duty selection unit 330 may be selected as stated in the following Table 1.

TABLE 1

| | Digital byte | | | | | | | | |
|---|---|---|---|---|---|---|---|---|---|
| | 1 | 2 | 3 | 4 | 5 | 6 | 7 | 8 | 9 |
| Switching pulse duty | 90% | 80% | 70% | 60% | 50% | 40% | 30% | 20% | 10% |

Figure 3:
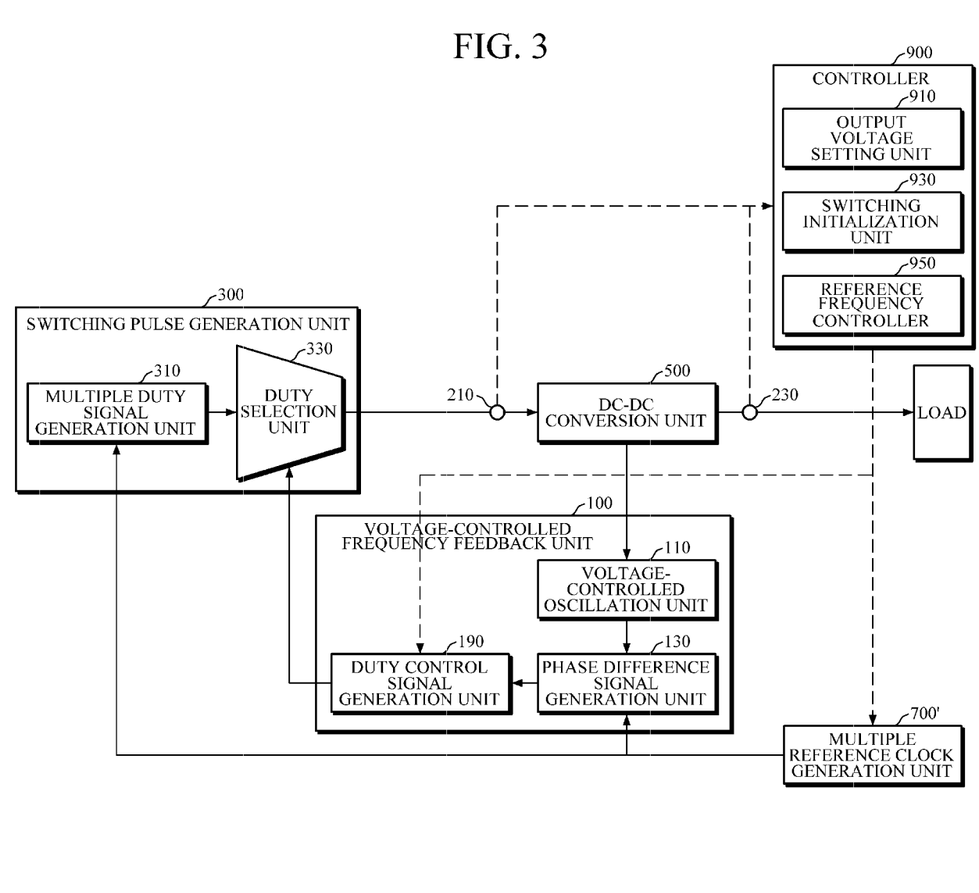
FIG. 3 is a block diagram illustrating a configuration of a power supply apparatus according to another embodiment.

FIG. 3 is a block diagram illustrating a configuration of a power supply apparatus according to another embodiment. Components similar to those of the embodiment shown in FIGS. 1 and 2 are denoted by the same reference numerals. These similar components will not be described.

In the illustrated embodiment, a multiple reference clock generation unit 700' outputs one of a plurality of reference clock signals having different frequencies from each other. For example, the multiple reference clock generation unit 700' may generate reference clock signals having ten (10) frequencies at a 100 KHz interval in frequencies of 1 MHz to 1.9 Mhz. One of the generated plurality of reference clock signals is selected and output. As another example, the multiple reference clock generation unit 700' may include a single clock generation circuit which generates and outputs a reference clock signal having an indicated frequency. For example, the reference clock may be divided and output through a controlled variable divider.

A switching pulse generation unit 300 generates and outputs a switching pulse obtained by changing a duty of the reference clock signal output from the multiple reference clock generation unit 700'. A DC-DC conversion unit 500 switches an input power by the switching pulse output from the switching pulse generation unit 300, converts it into a DC power and outputs the same. In one embodiment, the DC-DC conversion unit 500 may be a buck converter. A voltage-controlled frequency feedback unit 100 generates and outputs a duty control signal for controlling the duty of the switching pulse which is generated and output by the switching pulse generation unit 300 according to a phase difference between a feedback clock signal having a frequency proportional to the output voltage of the DC-DC conversion unit 500 and the reference clock signal output by the multiple reference clock generation unit 700'.

In the illustrated embodiment, the voltage-controlled frequency feedback unit 100 may include a voltage-controlled oscillation unit 110, a phase difference signal generation unit 130, and a duty control signal generation unit 190. The voltage-controlled oscillation unit 110 and the duty control signal generation unit 190 are similar to those of the embodiments shown in FIG. 1 or 2, and therefore will not be described in detail. The phase difference signal generation unit 130 is similar to that of the above-described embodiments, except for an aspect of generating a phase difference signal according to a phase difference between the feedback clock signal having a frequency proportional to the output voltage of the DC-DC conversion unit 500 and the reference clock signal output by the multiple reference clock generation unit 700'.

According to another aspect of the present invention, the frequency of the reference clock signal may be determined according to an external instruction signal. The power supply apparatus according to the illustrated embodiment further includes a controller 900. In one embodiment, the controller 900 may be implemented as a microprocessor or signal processing processor and a program thereof. As another example, the controller 900 may be implemented by including a dedicated controller or an artificial intelligence engine.

According to an aspect, the controller 900 may include an output voltage setting unit 910. The output voltage setting unit 910 outputs a reference clock selection signal for selecting a frequency of the reference clock signal to the multiple reference clock generation unit 700' according to an external instruction signal. The multiple reference clock generation unit 700' may select one of a plurality of reference clock signals having different frequencies from each other generated therein according to the reference clock selection signal, or set the frequency of the reference clock signal output therefrom. The voltage of the output power may be set by changing the frequency of the reference clock of the multiple reference clock generation unit 700'. In the illustrated embodiment, the voltage of the output power is increased as the frequency is increased.

Dynamic voltage scaling (DVS) is one of power-saving techniques used in a computer architecture, and adjusts a consumption power by dynamically increasing or decreasing an operation voltage of the used components. For example, the power supply according to the present invention may be applied to such dynamic voltage scaling.

According to another aspect of the present invention, the duty of the switching pulse and the frequency of the reference clock may be simultaneously controlled according to fluctuations in the output voltage of the DC-DC conversion unit. In the illustrated embodiment, the controller 900 may include a reference frequency controller 950. The reference frequency controller 950 measures input and output parameters of the DC-DC conversion unit 500, and outputs a reference clock selection signal for selecting one of the plurality of reference clock signals to the multiple reference clock generation unit 700'.

In the illustrated embodiment, the controller 900 measures the input voltage and current, as well as the output voltage and current of the DC-DC conversion unit 500 by an input terminal sensor 210 and an output terminal sensor 230, respectively. Each of the input terminal sensor 210 and the output terminal sensor 230 may include a voltage sensor and a current sensor. Further, the controller 900 may measure a settling time, efficiency, and ripple. The settling time is measured by repeating lock on/off states until the output voltage is settled after the input power is supplied at the beginning of the apparatus' startup. After measurement of the settling time is ended, the ripple and efficiency are measured in parallel. The ripple is measured by detecting a peak of the output voltage by a peak detector. The efficiency is obtained by calculating a ratio of input and output powers using the input voltage, input current, output voltage, and output current values, which are measured by the input terminal sensor 210 and the output terminal sensor 230.

In one embodiment, the reference frequency controller 950 periodically measures the output parameters, for example, the ripple and efficiency, and if the output parameters are not settled by pulse width modulation, the frequency of the reference clock signal output by the multiple reference clock generation unit 700' may be varied. For example, when the reference clock has a frequency fn, if the output parameter is not settled despite the pulse width control is performed by the voltage-controlled frequency feedback unit 100, the reference clock is changed to a frequency fn−1 to settle the output parameter. When increasing the switching frequency in the DC-DC converter, the efficiency is reduced and the ripple characteristics are deteriorated. The present invention may achieve settlement of these output parameters by varying the switching frequency in addition to the duty control through the feedback control.

According to another aspect of the present invention, the input and output parameters of the DC-DC conversion unit may be measured to determine initial values of control parameters of the DC-DC converter, and then the control parameters may be controlled to be added to and subtracted from the initial values according to the fluctuation in the output load. In the illustrated embodiment, the controller 900 may further include a switching initialization unit 930. The switching initialization unit 930 measures the input voltage, input current, output voltage, and output current of the DC-DC conversion unit 500, and determines and outputs initial values of reference clock selection signal and the duty control signal output by the voltage-controlled frequency feedback unit 100 so that at least one output parameter is settled.

In the illustrated embodiment, the controller 900 measures the input voltage and current, as well as the output voltage and current of the DC-DC conversion unit 500 by the input terminal sensor 210 and the output terminal sensor 230, respectively. Each of the input terminal sensor 210 and the output terminal sensor 230 may include a voltage sensor and a current sensor. Further, the controller 900 may measure a settling time, power efficiency, and ripple. The settling time is measured by repeating the lock on/off states until the output voltage is settled after the input power is supplied at the beginning of the apparatus' startup. After measurement of the settling time is ended, the ripple and power efficiency are measured in parallel. The ripple is measured by detecting a peak of the output voltage by a peak detector. The power efficiency is obtained by calculating a ratio of input and output powers using the input voltage, input current, output voltage, and output current values, which are measured by the input terminal sensor 210 and the output terminal sensor 230. A duty and a frequency of the switching pulse to achieve low ripple and high power efficiency at a set output voltage may be determined. For example, the duty and frequency of such a switching pulse may be determined through a search process of measuring output parameters while varying the duty at the highest frequency. In the illustrated embodiment, the duty control signal generation unit 190 and the multiple reference clock generation unit 700' may change the duty of the switching pulse and the frequency of the reference clock signal based on these initial set values, respectively according to fluctuations in the output voltage and output parameter, respectively. After the duty and frequency of the switching pulse are determined and set at the beginning of the apparatus' startup, the duty and frequency of the switching pulse may be varied through periodic feedback, and thereby maintaining the optimum output parameter.

The voltage-controlled frequency feedback unit 100 according to an embodiment may include a voltage-controlled oscillation unit 110, a phase difference signal generation unit 130, and a duty control signal generation unit 190. The voltage-controlled oscillation unit 110 and the phase difference signal generation unit 130 are similar to the corresponding configurations of the second embodiment shown in FIG. 2. The duty control signal generation unit 190 is similar to the corresponding configuration of the second embodiment shown in FIG. 2, but when the duty of the switching pulse is determined by the switching initialization unit 930 at the beginning of the apparatus' startup, the initial value of the duty control signal is set to the determined value.

In addition, when the frequency of the reference clock of the multiple reference clock generation unit 700' is changed by the reference frequency controller 950, the initial value of the duty control signal is set to an optimum value according to the set output voltage and the changed frequency of the reference clock. The initial values of the duty control signals for each output voltage and each frequency of the reference clock may be scanned at the beginning of the system and stored in an internal permanent memory, or may be stored in an internal permanent memory by a manufacturer when the power supply apparatus is initially manufactured.

Figure 4:
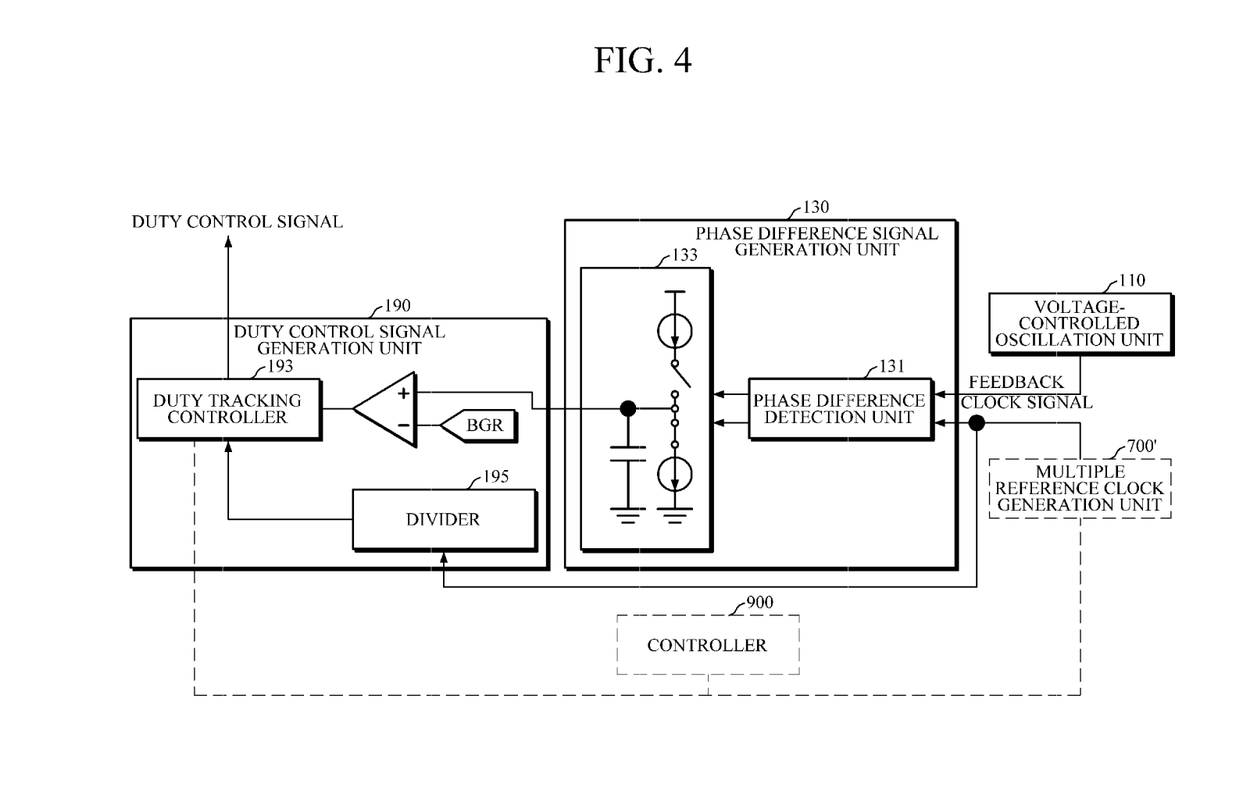
FIG. 4 is a block diagram illustrating a configuration of a voltage-controlled frequency feedback unit according to another embodiment.

According to another aspect of the present invention, the duty of the switching pulse may be controlled from an output of the charge pump which is charged and discharged according to the phase difference signal between the feedback clock signal and the reference clock signal. FIG. 4 is a block diagram illustrating a configuration of a voltage-controlled frequency feedback unit according to another embodiment. As shown in FIG. 4, the voltage-controlled frequency feedback unit according to another embodiment includes a voltage-controlled oscillation unit 110, a phase difference signal generation unit 130, and a duty control signal generation unit 190. The voltage-controlled oscillation unit 110 is similar to the corresponding configuration of the above-described embodiments. As shown in FIG. 4, in the voltage-controlled frequency feedback unit according to another embodiment, the phase difference signal generation unit 130 includes a phase difference detection unit 131 and a charge pump 133. The phase difference detection unit 131 detects a phase difference between a feedback clock signal output by the voltage-controlled oscillation unit 110 and a reference clock signal output by a multiple reference clock generation unit 700'. In the illustrated embodiment, the phase difference detection unit 131 may be a phase frequency detector that detects a phase difference between the feedback clock signal and the reference clock signal and outputs the detected phase difference signal. The charge pump 133 is charged and discharged according to the phase difference signal. In the illustrated embodiment, the charge pump 133 may be implemented as a pair of bipolar-switched current sources used in the phase locked loop.

As shown in FIG. 4, in the voltage-controlled frequency feedback unit according to another embodiment, the duty control signal generation unit 190 includes a filter unit 191 and a duty tracking controller 193. The filter unit 191 settles the output of the charge pump 133 and outputs phase difference voltage signal. In the illustrated embodiment, the filter unit 191 includes a comparator. The comparator outputs a difference in signals between the phase difference signal and a band gap reference signal. The bandgap reference signal is a reference signal having a constant voltage regardless of a temperature or power supply voltage, and the bandgap reference signal generation circuit is a known circuit. The duty is increased only when the phase difference is greater than the bandgap reference signal, i.e., when the output of the DC-DC conversion unit 100 differs from the reference value or higher than the rated voltage, and otherwise, the duty is decreased. In the illustrated embodiment, the output of the comparator is a digital signal obtained by converting an analog difference signal into a digital signal.

The duty tracking controller 193 receives the difference in signals output by the comparator, subtracts or adds it from or to the current duty control signal, and outputs a new duty control signal. In the illustrated embodiment, the duty tracking controller 193 outputs a duty control signal by synchronizing with the clock obtained by dividing the reference clock from the reference clock generation unit 700 by the divider 195. The division ratio of the divider 195 may be appropriately determined according to a degree of precision of the output power or response characteristics to the load. In one embodiment, the duty tracking controller 193 includes a register that stores values of the current duty control signal. When the clock is output from the divider 195, it is synchronized therewith, and the duty tracking controller 193 outputs a value obtained by adding the digital signal value output from the comparator 191 to the internal register as a new duty control signal. When a setting value of the duty control signal is output from any one of the output voltage setting unit 910 of the controller 900, the switching initialization unit 930 or the reference frequency controller 950, the value of the internal register may be set to the setting value.

While the present invention has been described through embodiments with reference to the accompanying drawings, the present invention is not limited to the above-described embodiments, and it will be understood by those skilled in the art that various modifications may be made therein without departing from the scope of the present invention as defined by the appended claims. The claims are intended to cover these modifications.

DESCRIPTION OF REFERENCE NUMERALS

100: Voltage-controlled frequency feedback unit
110: Voltage-controlled oscillation unit
130: Phase difference signal generation unit
131: Phase difference detection unit
133: Charge pump
190: Duty control signal generation unit
191: Filter unit
193: Duty tracking controller
195: Divider
210: Input terminal sensor
230: Output terminal sensor
300: Switching pulse generation unit
310: Multiple duty signal generation unit 330: Duty selection unit
500: DC-DC conversion unit
700: Reference clock generation unit
900: Controller
910: Output voltage setting unit
930: Switching initialization unit
950: Reference frequency controller

What is claimed is:

1. A power supply apparatus comprising:
a reference clock generation unit configured to generate and output a reference clock signal;
a switching pulse generation unit configured to generate and output a switching pulse obtained by changing a duty of the reference clock signal;
a DC-DC conversion unit configured to switch an input power by the switching pulse, convert it into a DC voltage and output the same; and
a voltage-controlled frequency feedback unit configured to generate and output a duty control signal for controlling a duty of the switching pulse generated and output by the switching pulse generation unit according to a phase difference between a feedback clock signal having a frequency proportional to an output voltage of the DC-DC conversion unit and the reference clock signal,
wherein the voltage-controlled frequency feedback unit comprises:
a voltage-controlled oscillation unit configured to oscillate and output the feedback clock signal having a frequency proportional to the output voltage of the DC-DC conversion unit,
a phase difference signal generation unit configured to detect a phase difference between the feedback clock signal and the reference clock signal, and output a phase difference signal; and
a duty control signal generation unit configured to generate and output the duty control signal for controlling the duty of the switching pulse generated and output by the switching pulse generation unit from the phase difference signal,
wherein the phase difference signal generation unit comprises:
a phase difference detection unit configured to detect the phase difference between the feedback clock signal and the reference clock signal; and
a charge pump which is charged and discharged according to a phase difference signal output from the phase difference detection unit, and
wherein the duty control signal generation unit comprises:
a comparator configured to output a difference in signals between the phase difference signal and a band gap reference signal; and
a duty tracking controller configured to receive the difference in signals output from the comparator, subtract or add it from or to the current duty control signal, and output a new duty control signal.

2. The power supply apparatus according to claim 1, wherein the duty control signal generation unit comprises:

a filter unit configured to settle an output of the charge pump and output a phase difference voltage signal; and a duty tracking controller configured to generate and output the duty control signal obtained by reflecting a current duty from the phase difference voltage signal.

3. The power supply apparatus according to claim 2, wherein the switching pulse generation unit comprises:

a multiple duty signal generation unit configured to generate a plurality of switching pulse signals obtained by modulating the reference clock signals so as to have different duties from each other;

a duty selection unit configured to output one signal selected by the duty control signal among the plurality of switching pulse signals.

4. A power supply apparatus comprising:

a multiple reference clock generation unit configured to output one of a plurality of reference clock signals having different frequencies from each other;

a switching pulse generation unit configured to generate and output a switching pulse obtained by changing a duty of the reference clock signal output from the multiple reference clock generation unit;

a DC-DC conversion unit configured to switch an input power by the switching pulse, convert it into a DC power and output the same; and a voltage-controlled frequency feedback unit configured to generate and output a duty control signal for controlling a duty of the switching pulse generated and output by the switching pulse generation unit according to a phase difference between a feedback clock signal having a frequency proportional to an output voltage of the DC-DC conversion unit and the reference clock signal output by the multiple reference clock generation unit; and a controller which includes an output voltage setting unit configured to output a reference clock selection signal for selecting a frequency of the reference clock signal to the multiple reference clock generation unit according to an external instruction signal.

5. The power supply apparatus according to claim 4, wherein the voltage-controlled frequency feedback unit comprises:

a voltage-controlled oscillation unit configured to oscillate and output the feedback clock signal having the frequency proportional to the output voltage of the DC-DC conversion unit, a phase difference signal generation unit configured to detect the phase difference between the feedback clock signal and the reference clock signal output from the multiple reference clock generation unit, and output a phase difference signal; and a duty control signal generation unit configured to generate and output the duty control signal for controlling the duty of the switching pulse generated and output by the switching pulse generation unit from the phase difference signal.

6. The power supply apparatus according to claim 5, wherein the phase difference signal generation unit comprises:

a phase difference detection unit configured to detect the phase difference between the feedback clock signal and the reference clock signal output from the multiple reference clock generation unit; and a charge pump which is charged and discharged according to the phase difference signal output from the phase difference detection unit.

7. The power supply apparatus according to claim 6, wherein the duty control signal generation unit comprises:

a comparator configured to output a difference in signals between the phase difference signal and a band gap reference signal; and a duty tracking controller configured to receive the difference in signals output from the comparator, subtract or add it from or to the current duty control signal, and output a new duty control signal.

8. A power supply apparatus comprising:

a multiple reference clock generation unit configured to output one of a plurality of reference clock signals having different frequencies from each other;

a switching pulse generation unit configured to generate and output a switching pulse obtained by changing a duty of the reference clock signal output from the multiple reference clock generation unit;

a DC-DC conversion unit configured to switch an input power by the switching pulse, convert it into a DC power and output the same; and a voltage-controlled frequency feedback unit configured to generate and output a duty control signal for controlling a duty of the switching pulse generated and output by the switching pulse generation unit according to a phase difference between a feedback clock signal having a frequency proportional to an output voltage of the DC-DC conversion unit and the reference clock signal output by the multiple reference clock generation unit; and a controller which includes a reference frequency controller configured to measure input and output parameters of the DC-DC conversion unit, and output a reference clock selection signal for selecting one of the plurality of reference clock signals to the multiple reference clock generation unit.

9. The power supply apparatus according to claim 8, wherein the controller further comprises:

a switching initialization unit configured to measure an input voltage, an input current, an output voltage, an output current, and at least one output parameter of the DC-DC conversion unit, and determine and output initial values of the reference clock selection signal and the duty control signal of the voltage-controlled frequency feedback unit so as to settle the output parameter.

* * * * *